United States Patent [19]

Ikeda et al.

[11] Patent Number: 5,465,007
[45] Date of Patent: Nov. 7, 1995

[54] HIGH FREQUENCY TRANSISTOR WITH REDUCED PARASITIC INDUCTANCE

[75] Inventors: Yasukazu Ikeda; Hideo Matsumoto; Susumu Sakamoto, all of Itami, Japan

[73] Assignee: Mitsubishi Denki Kabushiki Kaisha, Tokyo, Japan

[21] Appl. No.: 272,864

[22] Filed: Jul. 8, 1994

Related U.S. Application Data

[63] Continuation of Ser. No. 940,312, Sep. 3, 1992, abandoned.

[30] Foreign Application Priority Data

Sep. 5, 1991 [JP] Japan .................. 3-225670

[51] Int. Cl.⁶ .................. H01L 23/12; H01L 23/50
[52] U.S. Cl. .................. 257/584; 257/587; 257/666; 257/700
[58] Field of Search .................. 257/557, 565, 257/578, 584, 585, 587, 593, 532, 502, 507, 508, 690, 666, 692, 698, 700, 703

[56] References Cited

U.S. PATENT DOCUMENTS

| | | | |
|---|---|---|---|
| 3,916,434 | 10/1975 | Garboushian | 257/704 |
| 3,999,142 | 12/1976 | Presser et al. | 257/532 |
| 4,168,507 | 9/1979 | Yester, Jr. | 257/584 |
| 4,783,697 | 11/1988 | Benenti et al. | 257/584 |

FOREIGN PATENT DOCUMENTS

| | | | |
|---|---|---|---|
| 0157240 | 8/1985 | Japan | 257/532 |
| 0109332 | 5/1987 | Japan | 257/565 |

Primary Examiner—William Mentel
Assistant Examiner—Peter Toby Brown
Attorney, Agent, or Firm—Leydig, Voit & Mayer

[57] ABSTRACT

A semiconductor device includes a transistor mounted on the top surface of a substrate. A metal sheet is disposed on a metallized electrode on the substrate to which the emitter, for example, of the transistor is electrically connected. The emitter is electrically connected by a thin metal wire to the metal sheet. An MOS capacitor is disposed on the metal sheet, and a plated through-hole beneath the metal sheet connects the metallized electrode directly to a metallized ground electrode disposed on the bottom surface of the substrate.

3 Claims, 3 Drawing Sheets

HIGH FREQUENCY TRANSISTOR WITH REDUCED PARASITIC INDUCTANCE

This disclosure is a continuation of application Ser. No. 07/940,312, filed Sep. 3, 1992 and now abandoned.

BACKGROUND OF THE INVENTION

This invention relates to a semiconductor device including a high frequency, high output transistor and more particularly to such a semiconductor device with reduced parasitic inductance in the emitter circuit of the transistor.

DESCRIPTION OF THE PRIOR ART

FIG. 1 is a plan view of an example of a conventional semiconductor device, and FIG. 2 is a cross-sectional view along line II—II in FIG. 1. As shown in FIGS. 1 and 2, on a chip substrate 1 of an insulating ceramic having good thermal conductivity, such as beryllia (BeO), metallized electrodes 21, 22 and 23 are disposed in a predetermined pattern, as shown. As the metallized electrodes, three-layer electrodes having a structure such as W/Ni/Ag, W/Ni/Au, MoMn/Ni/Ag or MoMn/Ni/Au may be used.

A base lead 3 and a collector lead 4 are brazed to the top surfaces of the metallized electrodes 21 and 23, respectively. The substrate with the metallized electrodes and the base and collector leads 3 and 4 brazed to the respective metallized electrodes is referred to as a chip carrier. A high-frequency, high-power transistor 5 is mounted on the chip carrier, with its collector C contacting the metallized electrode 23. An MOS capacitor 6 is mounted on the metallized electrode 22. A metallic bridge 7 is disposed above and across the metallized electrode 23 and is connected to the metallized electrode 22. (As shown in FIG. 1, the metallic bridge 7 is spaced from the electrode, 23, i.e., "disposed above" does not require direct contact.)

The emitter E of the transistor 5 is electrically connected to the metallized electrode 23 and to the metallic bridge 7 by thin metallic wires 8, and the base B is connected to the MOS capacitor 6 by thin metallic wires 9. The MOS capacitor 6 is connected to the metallized electrodes 21 by means of thin metallic wires 10. The metallic bridge 7 is provided for reducing the parasitic inductance associated with the emitter electrode wiring of the transistor 5. The metallized electrode 22 is connected to a metallized grounding electrode 12 disposed on the opposite surface of the substrate 1, via metallization 11 on the sides of the substrate 1. (As shown in FIG. 2, the metallized grounding electrode 12 is in direct contact with the rear surface of the substrate 1, i.e., "disposed on " in this instance means direct contact). The MOS capacitor 6 is connected in the circuit between the base of the transistor 5 and ground in order to cancel the parasitic inductance which could be introduced into the circuit by the thin metallic wires 8, 9, 10 and the like. As shown in FIG. 3, the MOS capacitor 6 may be formed by disposing an n$^+$-type semiconductor layer 17 on the metallized electrode 22, then, an $SiO_2$ layer 18 on the layer 17, and an Au layer 19 on the layer 18. The thin metallic wires 9 and 10 are bonded to the Au layer 19.

The semiconductor device shown in FIG. 1 and 2 comprises a chip 16 mounted on arms 14 and 15 of a frame 13, as shown in FIG. 4. The frame 13 is formed of an Ni alloy, such as Kovar (29%Ni-17%Co-Fe) and 42 alloy (42%Ni-Fe). The arms 14 and 15 are cut to a desired length to provide the base lead 3 and the collector lead 4.

Because of the metallic bridge 7, which is provided for reducing the parasitic inductance of the thin metallic wire 8 connected to the transistor, in particular, its emitter E, a high degree of integration on the chip carrier cannot be achieved. The side metallization 11, which is used for connection to the bottom metallized ground electrode 12, has a parasitic inductance which is not negligible so that an adequate high frequency characteristic cannot be realized. Therefore, an object of the present invention is to provide a small-sized semiconductor device including a transistor having a reduced parasitic inductance in its emitter circuit. The reduction of the size improves the degree of integration.

SUMMARY OF THE INVENTION

A semiconductor device according to a first feature of the present invention comprises a high frequency transistor mounted on a chip substrate, and a metallized electrode to which a given electrode of the high frequency transistor is connected by thin metallic wires. This metallized electrode is connected, via a through-hole formed beneath the metallized electrode extending through the chip substrate, directly to a metallized ground electrode disposed on the opposite surface of the chip substrate. The metallized electrode may be an electrode to which the emitter, for example, of the transistor is connected by thin metallic wires.

A semiconductor device according to a second feature of the present invention comprises a transistor mounted on a chip substrate, and a metallized electrode to which a given electrode of the transistor is to be electrically connected. A metal sheet is disposed on the metallized electrode, and the given electrode of the transistor is electrically connected by thin metallic wires to the metal sheet. An MOS capacitor is disposed on and in electrical contact with the metal sheet. A through-hole is formed in the chip substrate under the metal sheet extending through the chip substrate connecting the metallized electrode to a metallized ground electrode on the opposite surface of the chip substrate. The emitter, for example, of the transistor may be connected to the metal sheet by thin metallic wires.

According to the present invention, because a metallized electrode to which a given electrode, for example, an emitter electrode, of a transistor is connected is coupled through a through-hole directly to a metallized ground electrode on the bottom surface of a chip substrate, the parasitic inductance associated with the emitter circuit is significantly reduced, which makes it possible to eliminate the for any metallic bridge of the prior art. Accordingly, the degree of integration can be increased and the size of the semiconductor device can be reduced. In addition, side metallization, which has been required in conventional devices, can also be eliminated.

DESCRIPTION OF PREFERRED EMBODIMENT

Figure 5:
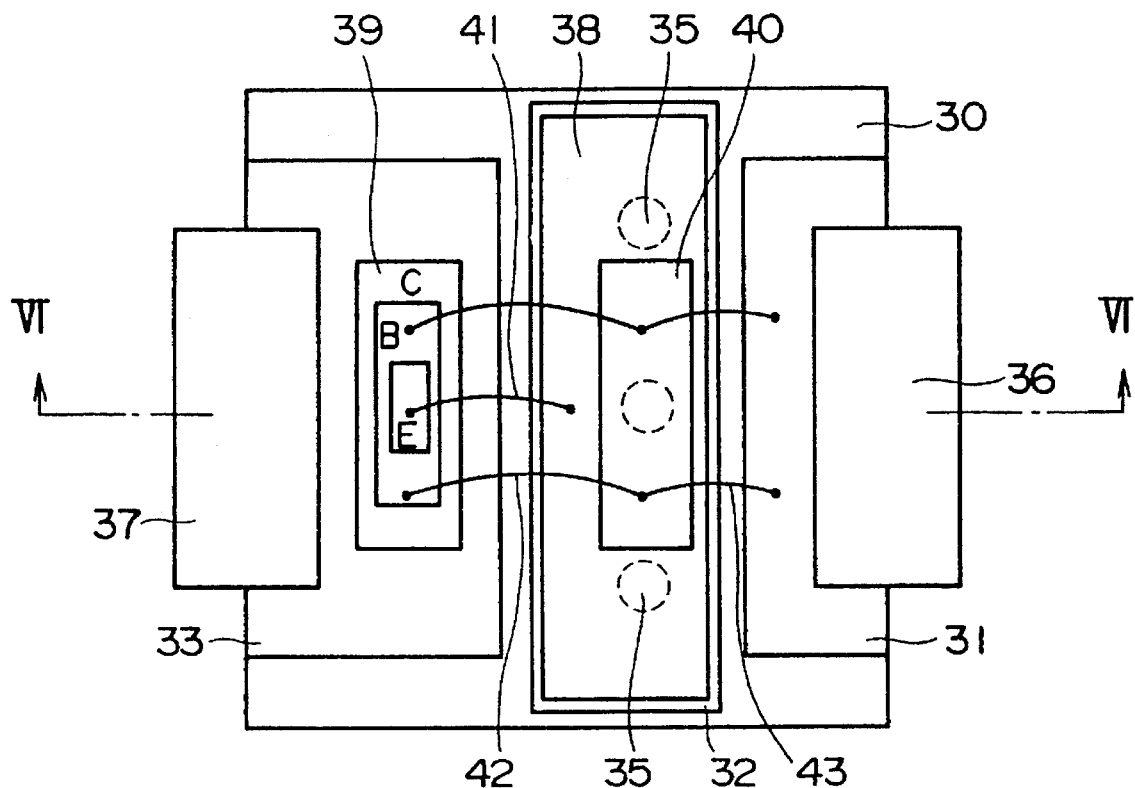
FIG. 5 is a plan view of a semiconductor device according to one embodiment of the present invention.
Figure 6:
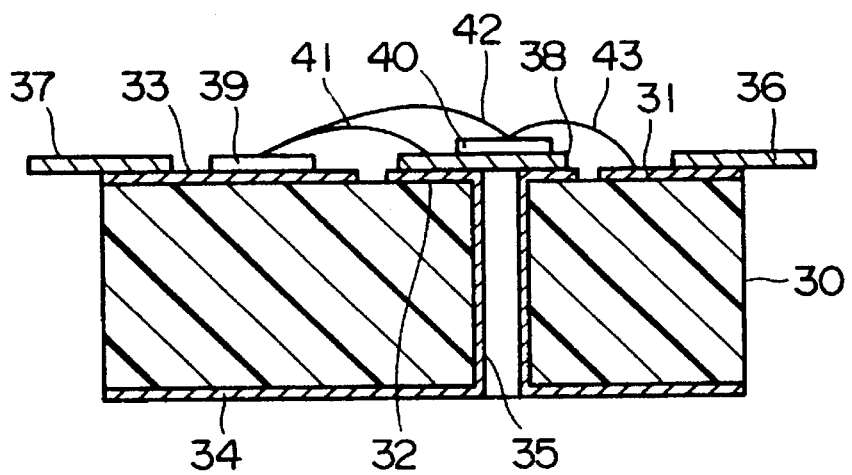
FIG. 6 is a cross-sectional view along line VI—VI of FIG. 5.

A semiconductor device according to one embodiment of the present invention is now described in detail with reference to FIGS. 5 and 6 which are plan and cross-sectional views of the device, respectively.

Metallized electrodes 31, 32 and 33 are disposed in a predetermined pattern with spaces therebetween, on a chip substrate 30 of an insulating ceramic having good thermal conductivity, such as beryllia (BeO). Similar to the previously described conventional device, each of the metallized electrodes is a three-layered structure, such as W/Ni/Ag, W/Ni/Au, MoMn/Ni/Ag or MoMn/Ni/Au. In the semiconductor device of the present invention, through-holes 35 extend through the substrate 30 for electrically connecting the metallized electrode 32 to a metallized ground electrode 34 disposed on the bottom surface of the substrate 30.

A base lead 36 and a collector lead 37 are brazed respectively to the metallized electrodes 31 and 33 with an Ag-Cu brazing alloy. The base lead 36 and the collector lead 37 are a frame material of an Ni alloy, such as Kovar (29% Ni-17% Co-Fe) and 42 alloy (42% Ni-Fe), like those of the conventional device. A metal sheet 38 is brazed to the upper surface of the metallized electrode 32. The metal sheet 38 is a frame material of an Ni alloy similar to the frame material for the base and collector leads.

Figure 3:
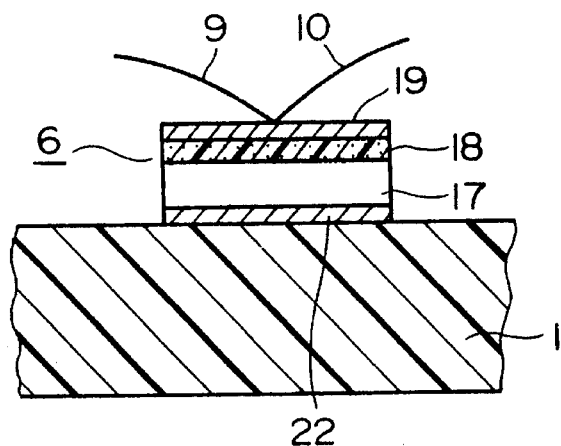
FIG. 3 is a cross-sectional view of an example of an MOS capacitor disposed on a chip of the semiconductor device of FIG. 1.
Figure 4:
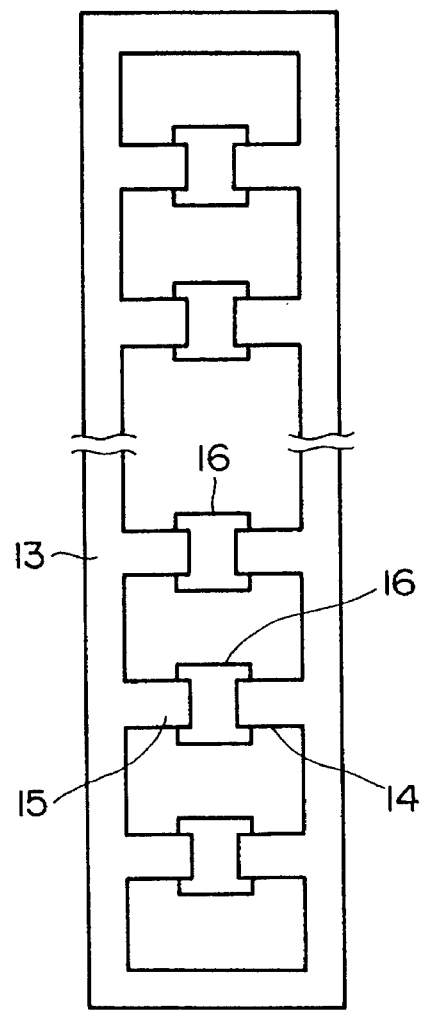
FIG. 4 shows a chip brazed to a frame in the conventional semiconductor device of FIG. 1.

A high frequency, high output transistor 39 is mounted on the metallized electrode 33, with its collector C being in contact with the metallized electrode 33. An MOS capacitor 40 is mounted on the metal sheet 38 on the metallized electrode 32. The emitter E of the transistor 39 is connected by a thin metallic wire 41 to the metal sheet 38, and the base B is connected to the MOS capacitor 40 by thin metallic wires 42. The MOS capacitor 40 is connected by metallic thin wires 43 to the metallized electrode 31. The structure of the MOS capacitor 40 may be similar to that of the MOS capacitor shown in FIG. 3.

When the above-described semiconductor device is observed in terms of an electric circuit configuration, it operates as a grounded-emitter circuit with the collector C of the transistor 39 being connected to the collector lead 37, the emitter E being connected by the through-holes 35 to the metallized ground electrode 34, and the base B being connected to the base lead 36. The MOS capacitor 40 connected between the base B of the transistor 39 and the metallized ground electrode 34 cancels the parasitic inductance which is introduced into the circuit by the thin metallic wires 41, 42, 43.

The upper ends of the through-holes 35 are closed by the metal sheet 38 on which the MOS capacitor 40 is mounted, as previously stated, but the lower ends are normally open so that gas, which is produced during baking of the substrate 30 and brazing of the lead frame and the metal sheet, can rapidly escape from the open ends of the through-holes 35. Furthermore, with the lower ends of the through-holes 35 left open, the metallization material for metallizing the respective electrodes can enter into the through-holes 35 to thereby reduce reactance including inductive and resistive components.

Figure 1:
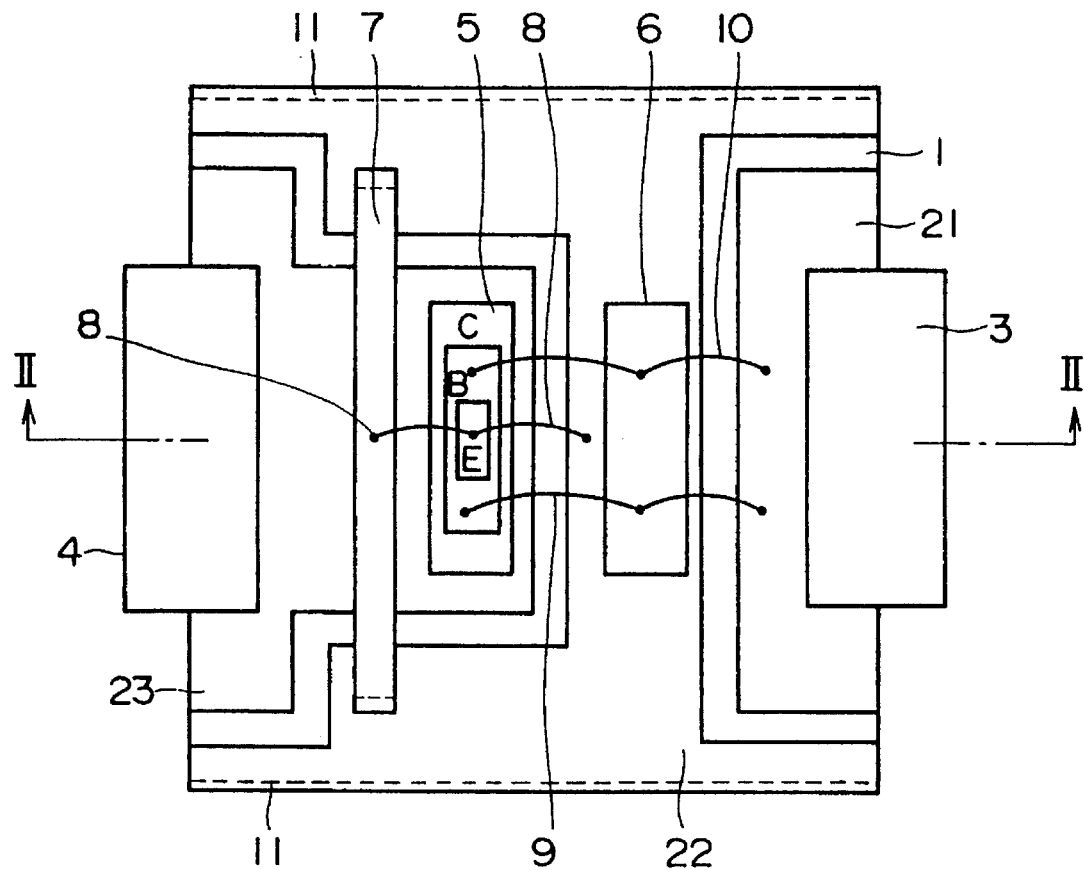
FIG. 1 is a plan view showing a conventional semiconductor device.
Figure 2:
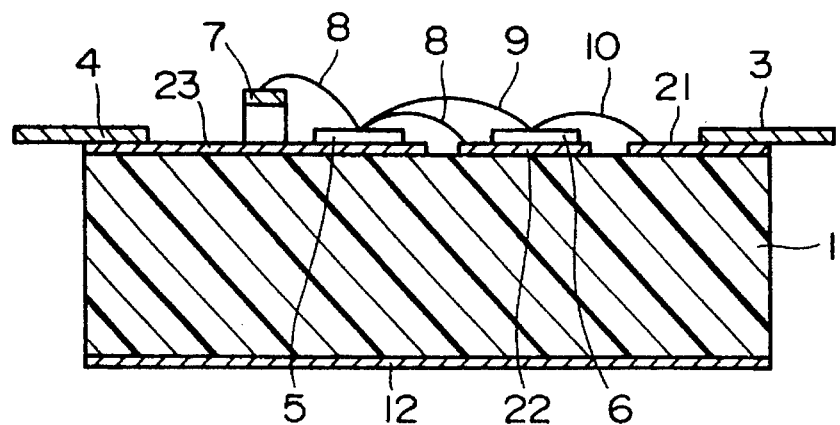
FIG. 2 is a cross-sectional view along a line II—II of FIG. 1.

As described above, in the semiconductor device of the present invention, because the through-holes 35 are formed in the insulating substrate 30 for connecting a metallized electrode, for example, the electrode 32, on the upper surface of the substrate directly to the metallized ground electrode 34 on the bottom surface of the substrate, it is possible to ground an electrode of the high frequency, high output transistor 39 mounted on the substrate, through a shortest path, without providing a side metallization. Thus, the parasitic inductance is significantly smaller than that of conventional semiconductor devices such as the one shown in FIG. 1, and, accordingly, a superior high frequency characteristic is achieved. Furthermore, according to the present invention, a metallic bridge is eliminated so that the device can be made small and integrated to a high degree.

It should be noted that in the illustrated embodiment, through-holes are formed in the substrate portion beneath the metal sheet 38 to which the emitter E of the transistor 39 is to be connected, but, depending on the transistor configuration, through-holes may be formed in the substrate beneath other metallized electrodes to which an electrode to be grounded of the transistor is connected.

What is claimed is:

1. A semiconductor device comprising:

an electrically insulating substrate having opposed top and bottom surfaces;

first, second, and third metallized electrodes disposed on the top surface of said substrate;

a high frequency transistor having first, second, and third electrodes and mounted on said first metallized electrode, said first electrode of said transistor being electrically connected to said first metallized electrode;

a metal sheet disposed on said second metallized electrode;

a wire connecting said Second electrode to said metal sheet, thereby electrically connecting said second electrode of said transistor to said second metallized electrode via said metal sheet;

a wire connecting said third electrode of said transistor to said third metallized electrode;

a through-hole extending through said substrate and having an inside surface; and a metallized ground electrode disposed on the bottom surface of said substrate and continuously extending on the inside surface of the through-hole, said metallized ground electrode being electrically connected to said second metallized electrode and said metal sheet covering and closing the through-hole at the top surface of said substrate, the through-hole being open at the bottom surface of said substrate.

2. A semiconductor device comprising:

an electrically insulating substrate having opposed top and bottom surfaces;

first, second, and third metallized electrodes disposed on the top surface of said substrate;

a high frequency transistor having an emitter, a base, and a collector disposed on said first metallized electrode with the collector contacting said first metallized electrode;

a metal sheet disposed on said second metallized electrode;

a wire connecting said emitter of said transistor to said metal sheet, thereby electrically connecting said emitter of said transistor to said second metallized electrode via said metal sheet;

a wire connecting the base of said transistor to said third metallized electrode;

a through-hole extending through said substrate and having an inside surface; and a metallized ground electrode disposed on the bottom surface of said substrate and continuously extending on the inside surface of the through-hole, said metallized ground electrode being electrically connected to said second metallized electrode, said metal sheet covering and closing the through-hole at the top surface of said substrate, the through-hole being open at the bottom surface of said substrate.

3. A semiconductor device comprising:

an electrically insulating substrate having opposed top and bottom surfaces;

first, second, and third metallized electrodes disposed on the top surface of said substrate;

a high frequency transistor having an emitter, a base, and a collector disposed on said first metallized electrode with the collector contacting said first metallized electrode;

a metal sheet disposed on said second metallized electrode;

an MOS capacitor disposed on said metal sheet;

a wire connecting said emitter of said transistor to said metal sheet, thereby electrically connecting said emitter of said transistor to said second metallized electrode via said metal sheet;

wires connecting said base of said transistor to said MOS capacitor and to said third metallized electrode;

a through-hole extending through said substrate and having an inside surface; and a metallized ground electrode disposed on the bottom surface of said substrate and continuously extending on the inside surface of the through-hole, said metallized ground electrode being electrically connected to said second metallized electrode under said metal sheet, said metal sheet covering and closing the through-hole at the top surface of said substrate, the through-hole being open at the bottom surface of said substrate.

* * * * *